United States Patent
Cheng et al.

(10) Patent No.: US 7,978,794 B2
(45) Date of Patent: Jul. 12, 2011

(54) FRONT-END FOR DIGITAL VIDEO RECEIVER AND METHOD FOR AUTOMATIC GAIN CONTROL THEREOF

(75) Inventors: Shin-Shiuan Cheng, Tainan County (TW); Ming-Yeong Chen, Tainan County (TW); Shyuan Liao, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 925 days.

(21) Appl. No.: 11/898,841

(22) Filed: Sep. 17, 2007

(65) Prior Publication Data

US 2009/0074118 A1   Mar. 19, 2009

(51) Int. Cl.
*H04L 27/08* (2006.01)
(52) U.S. Cl. ............ 375/345; 455/234.1; 455/240.1; 455/245.1; 327/306; 327/332
(58) Field of Classification Search .......... 375/316, 375/319, 345; 455/232.1, 234.1, 234.2, 240.1, 455/245.1, 247.1, 250.1, 67.13; 327/306, 327/307, 331, 332
See application file for complete search history.

(56) References Cited

U.S. PATENT DOCUMENTS

| | | | |
|---|---|---|---|
| 6,160,443 A * | 12/2000 | Maalej et al. | 329/304 |
| 6,369,857 B1 | 4/2002 | Balaban et al. | |
| 6,459,458 B1 | 10/2002 | Balaban | |
| 6,728,524 B2 * | 4/2004 | Yamanaka et al. | 455/232.1 |
| 6,965,656 B2 * | 11/2005 | Koizumi | 375/345 |
| 7,054,395 B2 * | 5/2006 | Azakami et al. | 375/345 |
| 7,715,886 B2 * | 5/2010 | Kanno et al. | 455/574 |

FOREIGN PATENT DOCUMENTS

TW           530491 B       5/2003

* cited by examiner

*Primary Examiner* — Dac V Ha
(74) *Attorney, Agent, or Firm* — Rabin & Berdo, P.C.

(57) ABSTRACT

A method for automatic gain control of a front-end for a digital video receiver is provided. The method includes the following steps. First, a radio frequency signal is received and converted to an intermediate frequency signal. Then, the IF signal is amplified according to a gain. Next, the amplified IF signal is demodulated into a base-band signal, and the base-band signal is encoded into a transport stream. After that, a DC level of a pulse width modulation signal is controlled by at least one variable resistor to adjust the gain, the PWM signal being related to a setting of the gain. Afterwards, a BER measurement at each potential setting of the gain and the variable resistor under one or more power levels of the RF signal is read, and an optimum setting of the gain and the variable resistor is selected according to the BER measurements.

16 Claims, 3 Drawing Sheets

FRONT-END FOR DIGITAL VIDEO RECEIVER AND METHOD FOR AUTOMATIC GAIN CONTROL THEREOF

BACKGROUND OF THE INVENTION

1. Field of the Invention

The invention relates in general to a front-end for a digital video receiver and a method for automatic gain control thereof, and more particularly to a front-end for a digital video receiver and a method for automatic gain control thereof that may save time.

2. Description of the Related Art

Usually, in the applications of the wireless communication technology, when the power level of the received radio frequency (RF) signal changes, the output of the wireless communication system also changes therewith. In order to obtain the best output, a method for automatic gain control (AGC) is utilized for tuning.

FIG. 1 (Prior Art) is a schematic illustration showing a front-end 100 of a conventional communication system. Referring to FIG. 1, the front-end 100 includes a tuner 102, an intermediate frequency (IF) amplifier 104, a demodulator 106 and a low pass filter 108. The tuner 102 receives a RF signal RF and converts the RF signal RF to an IF signal IF. The IF amplifier 104 has a gain, and the IF amplifier 104 amplifies the IF signal IF according to the gain.

The demodulator 106 demodulates the amplified IF signal IF into a base-band signal, and encodes the base-band signal to a transport stream TS. Besides, the demodulator 106 outputs a pulse width modulation (PWM) signal PWM, which is related to the gain of the IF amplifier 104. The demodulator 110 has an internal automatic gain target AGC_target.

The low pass filter 108 includes a capacitor C and resistors R1 to R4, as shown in FIG. 1, wherein the resistors R2 and R4 are variable resistors. The low pass filter 108 passes a DC level of the PWM signal PWM to be an automatic gain control signal AGCS, and feeds the automatic gain control signal AGCS back to the IF amplifier 104 to control the gain of the IF amplifier 104, and thus to change the transport stream TS to obtain a better display image frame.

Usually, the automatic gain target AGC_target of the demodulator 106, the resistor R2 and the resistor R4 of the low pass filter 108 are changed to control the gain of the IF amplifier 104. However, during the tuning process, it is time-consuming and complicated to try many combinations of the automatic gain target AGC_target, the resistor R2 and the resistor R4. In addition, when the received RF signal RF is a small signal, the combination of the automatic gain target AGC_target, the resistor R2 and the resistor R4 capable of enabling the better display image frame is also different from that in the condition when the received RF signal RF is a large signal.

SUMMARY OF THE INVENTION

The invention is directed to a front-end for a digital video receiver and a method for automatic gain control thereof, in which a newly added device is utilized to automatically tune the gain, and the tuning time may be greatly shortened by recording a corresponding gain corresponding to the power level of the radio frequency signal.

According to a first aspect of the present invention, a front-end for a digital video receiver is provided. The front-end includes an intermediate frequency (IF) amplifier, a demodulator and an automatic gain controller. The IF amplifier has a gain, and amplifies an IF signal. The demodulator demodulates the amplified IF signal into a base-band signal and encodes the base-band signal into a transport stream. The automatic gain controller automatically adjusts the gain of the IF amplifier based on a pulse width modulation (PWM) signal, related to a setting of the gain, outputted form the demodulator.

According to a second aspect of the present invention, a method for automatic gain control of a front-end for a digital video receiver is provided. The method includes the following steps. First, a radio frequency signal is received and converted to an intermediate frequency signal. Then, the IF signal is amplified according to a gain. Next, the amplified IF signal is demodulated into a base-band signal, and the base-band signal is encoded into a transport stream. After that, a DC level of a pulse width modulation signal is controlled by at least one variable resistor to adjust the gain, the PWM signal being related to a setting of the gain. Afterwards, a BER measurement at each potential setting of the gain and the variable resistor under one or more power levels of the RF signal is read, and an optimum setting of the gain and the variable resistor is selected according to the BER measurements.

The invention will become apparent from the following detailed description of the preferred but non-limiting embodiments. The following description is made with reference to the accompanying drawings.

DETAILED DESCRIPTION OF THE INVENTION

The invention provides a front-end for a digital video receiver and a method for automatic gain control thereof, which uses a newly added element to automatically tune the gain. In addition, it is also possible to record a RF signal and a gain corresponding to its power level into a look up table (LUT) to greatly shorten the tuning time.

Figure 1:
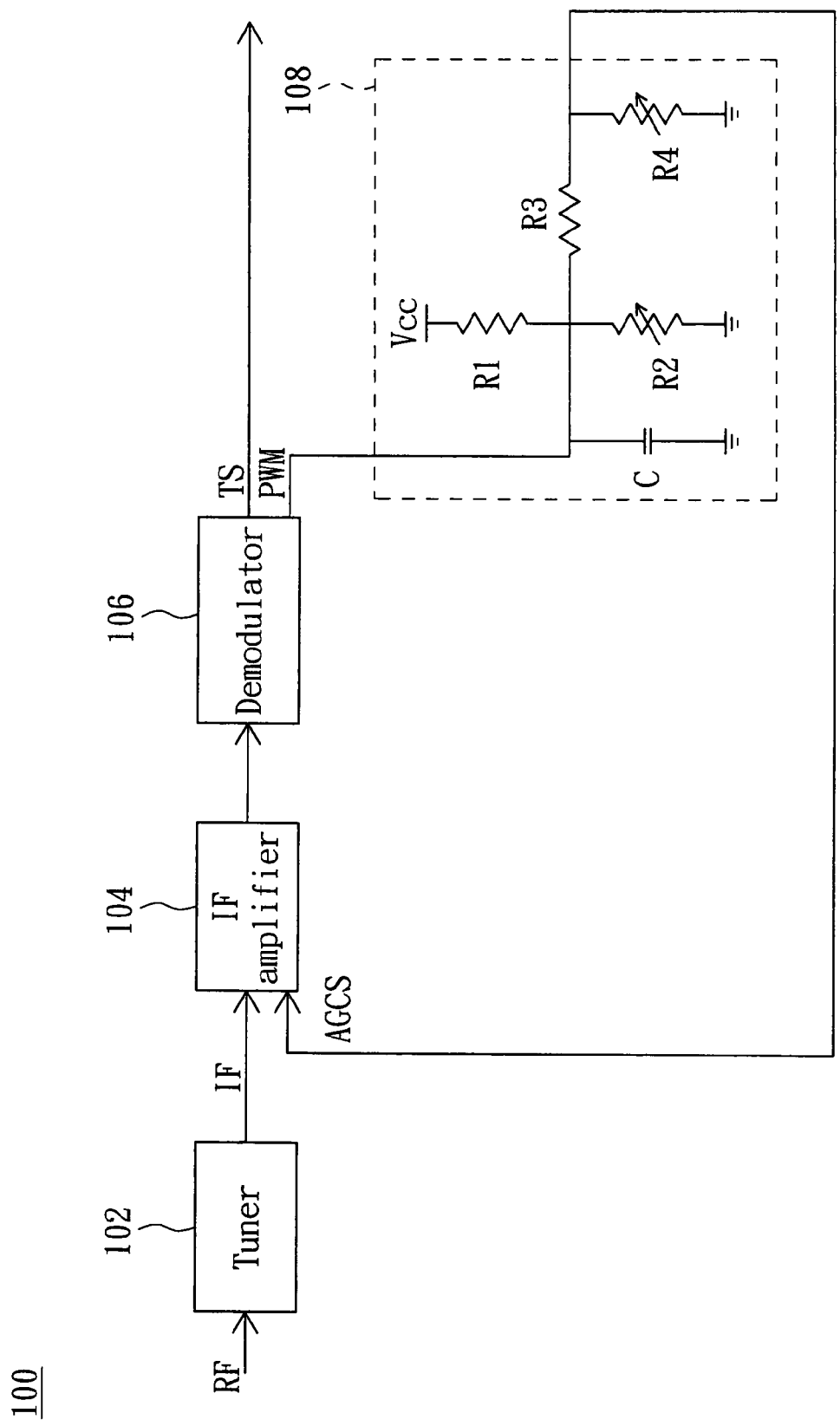
FIG. 1 (Prior Art) is a schematic illustration showing a front-end of a conventional communication system.
Figure 2:
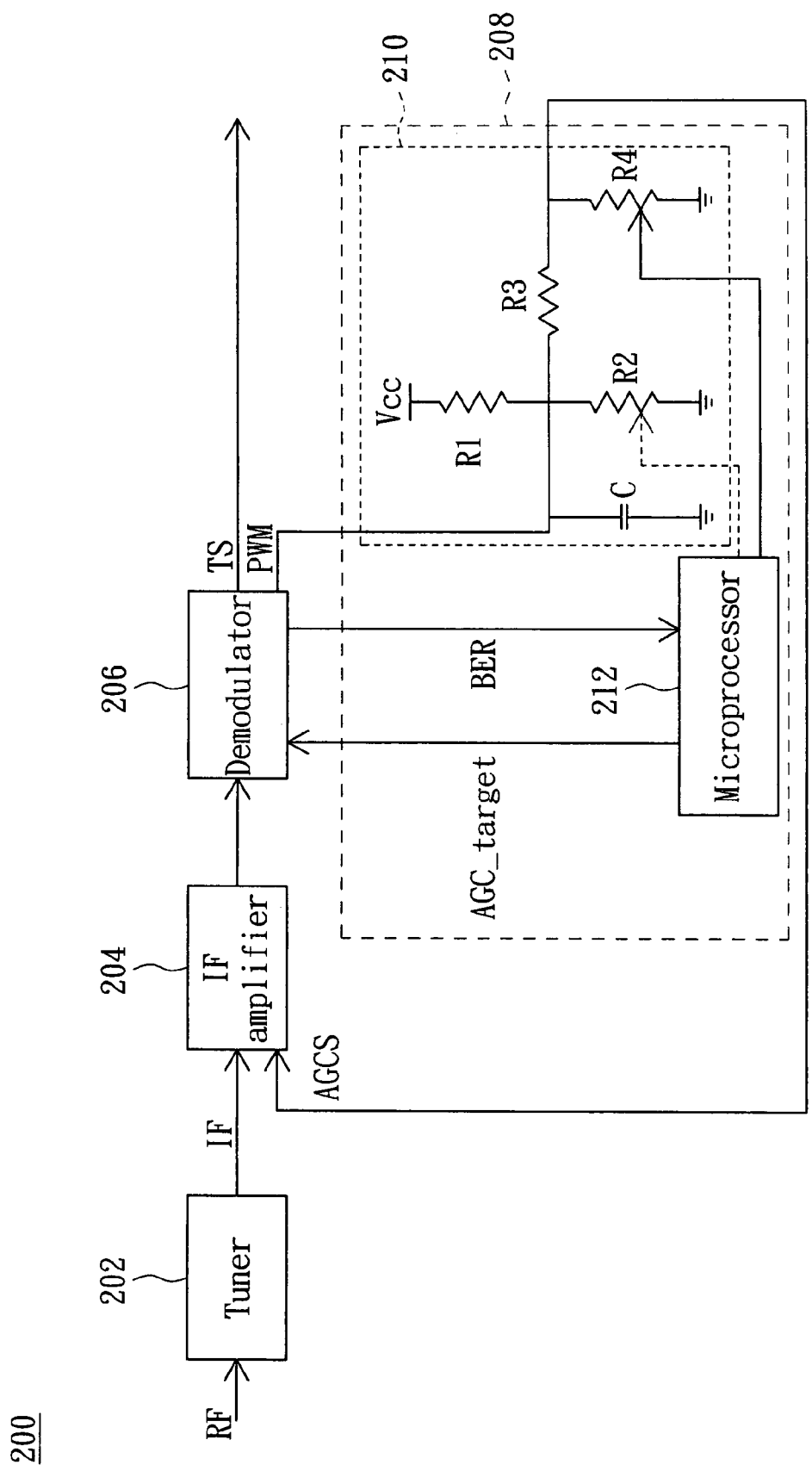
FIG. 2 is schematic illustration showing a front-end for a digital video receiver according to a preferred embodiment of the invention.

FIG. 2 is a schematic illustration showing a front-end for a digital video receiver according to the preferred embodiment of the invention. Referring to FIG. 2, the front-end 200 includes a tuner 202, an intermediate frequency (IF) amplifier 204, a demodulator 206 and an automatic gain controller 208. The tuner 202 receives a radio frequency (RF) signal RF and converts the RF signal RF to an IF signal IF. The IF amplifier 204 has a gain, and amplifies the IF signal IF according to the gain.

The demodulator 206 demodulates the amplified IF signal IF into a base-band signal, and encodes the base-band signal to a transport stream TS. As the demodulator 206 demodulates the amplified IF signal IF into the base-band signal, a corresponding bit error rate (BER) measurement is obtained. The BER measurement is the percentage of bits that have errors relative to the total number of bits received. The transport stream is outputted to a display (not shown in FIG. 2) to display a display image frame. The demodulator 206 also outputs a pulse width modulation (PWM) signal PWM, which is related to a setting of the gain of the IF amplifier 204. Besides, the demodulator 206 has an internal automatic gain target AGC_target. The demodulator 206 compares the gain of the IF amplifier 204 with the automatic gain target AGC_target and accordingly outputs the PWM signal PWM. The PWM signal PWM is used to change the gain of the IF amplifier 204, such that the gain of the IF amplifier 204 can be the same as the automatic gain target AGC_target.

The automatic gain controller 208 adjusts the gain of the IF amplifier 204 based on the PWM signal PWM. The automatic gain controller 208 includes a low pass filter 210 and a microprocessor 212. The low pass filter 210 is substantially an RC network, and has at least one variable resistor. The low pass filter 210 passes a DC level of the PWM signal PWM to be an automatic gain control signal AGCS, which is to control the gain of the IF amplifier 204. The low pass filter 210 includes a capacitor C, a first resistor R1, a second resistor R2, a third resistor R3 and a fourth resistor R4. The capacitor C has a first terminal that receives the PWM signal PWM, and a second terminal coupled to a grounding voltage. The first resistor R1 has a first terminal coupled to an operation voltage Vcc, and a second terminal coupled to the first terminal of the capacitor C. The second resistor R2 has a first terminal coupled to a second terminal of the first resistor R1 and a second terminal coupled to a grounding voltage. The third resistor R3 has a first terminal coupled to the second terminal of the first resistor R1. The fourth resistor R4 has a first terminal coupled to a second terminal of the third resistor R3 and a second terminal coupled to the grounding voltage.

The microprocessor 212, under one or more power levels of the RF signal RF, reads a bit error rate (BER) measurement from the demodulator 206 at each potential setting of the gain and the variable resistor, and selects an optimum setting of the gain and the variable resistor according to the BER measurements. The microprocessor 212 is substantially an 8051 chip. The microprocessor 212 changes the variable resistor of the low pass filter 210 to control the gain of the IF amplifier 204, such that the gain of the IF amplifier 204 can be the same as the automatic gain target AGC_target. Meanwhile the BER measurement read from the demodulator 206 is a minimum. Thus, the transport stream TS may display a better display image frame on the display. Besides, the microprocessor 212 may change the value of the automatic gain target AGC_target of the demodulator 206 to obtain the BER measurements at different setting of the gain and the variable resistor under one or more power levels of the RF signal RF.

The fourth resistor R4 of the low pass filter 210 is a variable resistor. The microprocessor 212 changes the resistance value of the fourth resistor R4 to change the time constant of the RC network, such that the DC level of the PWM signal PWM is obtained to be the automatic gain control signal AGCS. The look up table recorded by the microprocessor 212 also correspondingly records the resistance value of the fourth resistor R4. In addition, the resistance value of the second resistor R2 is usually set to be far greater than that of the first resistor R1. However, the resistance value of the second resistor R2 is usually fixed in order to save the tuning time. In order to enhance the precision, however, the second resistor R2 may be a variable resistor and is similarly tuned by the microprocessor 212, so the tuning of the second resistor R2 is depicted by the dashed line of FIG. 2. Similarly, when the resistance value of the second resistor R2 is adjustable, the look up table also correspondingly records the resistance value of the second resistor R2.

Figure 3:
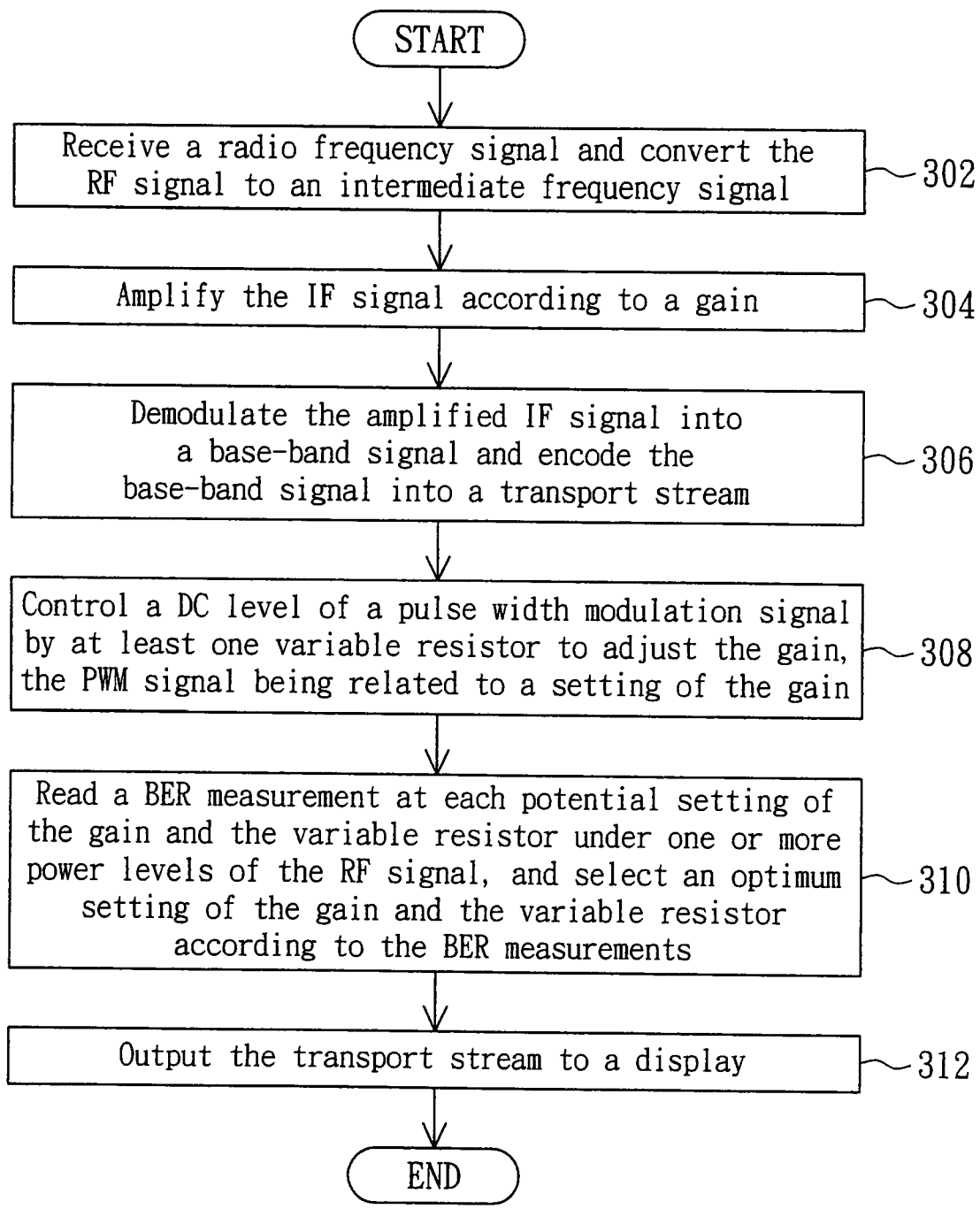
FIG. 3 is a flow chart showing a method for automatic gain control of a front-end for a digital video receiver according to the preferred embodiment of the invention.

FIG. 3 is a flow chart showing a method for automatic gain control of a front-end for a digital video receiver according to the preferred embodiment of the invention. First, step 302 receives a radio frequency (RF) signal and converts the RF signal to an intermediate frequency (IF) signal. Next, step 304 amplifies the IF signal according to a gain. Then, step 306 demodulates the amplified IF signal into a base-band signal and encodes the base-band signal into a transport stream. Next, step 308 controls a DC level of a pulse width modulation (PWM) signal by at least one variable resistor to adjust the gain, the PWM signal being related to a setting of the gain.

Then, step 310 reads a BER measurement at each potential setting of the gain and the variable resistor under one or more power levels of the RF signal, and selects an optimum setting of the gain and the variable resistor according to the BER measurements. Afterwards, step 312 outputs the transport stream to a display for displaying a display image frame. In the above-mentioned automatic gain control method, the error bit rate can reflect the display quality of the display image frame. When the error bit rate gets lower, the display quality of the display image frame gets better. When the error bit rate is too high, the display quality of the display image frame is poor. Thus, it is general to tune the condition that the error bit rate is a minimum in order to enhance the display quality of the display. When the error bit rate is a minimum, the power level of the RF signal and its corresponding gain are recorded into a look up table (LUT). When the RF signal with a predetermined power is received, the corresponding gain can be found from the look up table, and the IF signal is amplified according to the gain without repeated tuning.

According to the front-end for a digital video receiver and a method for automatic gain control thereof according to the embodiment of the invention, a newly added microprocessor 212 is utilized such that the automatic gain target AGC_target, the fourth resistor R4 and the second resistor R2 can be automatic tuned in the AGC manner without repeated and complicated tries. In addition, the power levels of the RF signal RF, the gain corresponding to the power level of the RF signal RF, the automatic gain target AGC_target, the fourth resistor R4 and the second resistor R2 are recorded into the look up table (LUT). When the RF signal with the same or approximate power level, the desired tuning can be found or estimated according to the look up table so that the tuning time can be greatly shortened.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A front-end for a digital video receiver, comprising:
    an IF amplifier having a gain and for amplifying an intermediate frequency (IF) signal;
    a demodulator for demodulating the amplified IF signal into a base-band signal and encoding the base-band signal into a transport stream; and
    an automatic gain controller for automatically adjusting the gain of the IF amplifier based on a pulse width modulation (PWM) signal, which is related to a setting of the gain, outputted from the demodulator, and under one or more power levels of a radio frequency (RF) signal, the automatic gain controller reads a BER (bit error rate) measurement from the demodulator and changes an automatic gain target of the demodulator according to the BER measurement.

2. The front-end for a digital video receiver according to claim 1, further comprising:
    a tuner for receiving the radio frequency (RF) signal and converting the RF signal to the IF signal.

3. The front-end for a digital video receiver according to claim 1, wherein the demodulator has the automatic gain target, the demodulator compares the gain with the automatic gain target and outputs the PWM signal accordingly.

4. The front-end for a digital video receiver according to claim 3, wherein the automatic gain controller comprises:
- a low pass filter having at least one variable resistor and for passing a DC level of the PWM signal to adjust the gain of the IF amplifier; and
- a microprocessor, under one or more power levels of the RF signal, for reading the BER measurement from the demodulator at each potential setting of the gain and the variable resistor, and selecting an optimum setting of the gain and the variable resistor according to the BER measurements.

5. The front-end for a digital video receiver according to claim 4, wherein the demodulator demodulates the amplified IF signal into the base-band signal and accordingly obtains the BER measurement at the corresponding power level.

6. The front-end for a digital video receiver according to claim 4, wherein the low pass filter comprises:
- a capacitor having a first terminal for receiving the PWM signal and a second terminal coupled to a grounding voltage;
- a first resistor having a first terminal coupled to an operation voltage and a second terminal coupled to the first terminal of the capacitor;
- a second resistor having a first terminal coupled to a second terminal of the first resistor, and a second terminal coupled to the grounding voltage;
- a third resistor having a first terminal, which is coupled to the second terminal of the first resistor; and
- a fourth resistor having a first terminal coupled to a second terminal of the third resistor, and a second terminal coupled to the grounding voltage,
- wherein the fourth resistor is the variable resistor, and the microprocessor controls a resistance value of the fourth resistor to adjust the gain of the IF amplifier.

7. The front-end for a digital video receiver according to claim 6, wherein a resistance value of the second resistor is far greater than a resistance value of the first resistor.

8. The front-end for a digital video receiver according to claim 7, wherein the resistance value of the second resistor is fixed.

9. The front-end for a digital video receiver according to claim 7, wherein the second resistor is another variable resistor, and the microprocessor also controls the resistance value of the second resistor to adjust the gain of the IF amplifier.

10. The front-end for a digital video receiver according to claim 4, wherein the microprocessor is an 8051 chip.

11. The front-end for a digital video receiver according to claim 1, wherein the transport stream is outputted to a display.

12. A method for automatic gain control of a front-end for a digital video receiver, comprising the steps of:
- receiving a radio frequency (RF) signal and converting the RF signal to an intermediate frequency (IF) signal;
- amplifying the IF signal according to a gain;
- demodulating the amplified IF signal into a base-band signal and encoding the base-band signal into a transport stream;
- controlling a DC level of a pulse width modulation (PWM) signal by at least one variable resistor to adjust the gain, the PWM signal being related to a setting of the gain; and
- reading a BER measurement at each potential setting of the gain and the variable resistor under one or more power levels of the RF signal, and selecting an optimum setting of the gain and the variable resistor according to the BER measurements.

13. The method according to claim 12, wherein when the amplified IF signal is demodulated into the base-band signal, the BER measurement at the corresponding power level is obtained.

14. The method according to claim 12, further comprising;
- recording the corresponding power level, the gain and the resistance value of the variable resistor when the BER measurement is lowest.

15. The method according to claim 14, further comprising:
- amplifying the IF signal at the corresponding setting of the gain if the power level of RF signal is received again.

16. The method according to claim 12, further comprising;
- outputting the transport stream to a display.

* * * * *